United States Patent
Schneider et al.

(10) Patent No.: US 7,209,987 B1
(45) Date of Patent: Apr. 24, 2007

(54) EMBEDDED SYSTEM DESIGN THROUGH SIMPLIFIED ADD-ON CARD CONFIGURATION

(75) Inventors: Eric D. Schneider, Shorewood, MN (US); Gary Nachazel, Dayton, MN (US); John Ryan, Maple Grove, MN (US)

(73) Assignee: Eridon Corporation, Shorewood, MN (US)

( * ) Notice: Subject to any disclaimer, the term of this patent is extended or adjusted under 35 U.S.C. 154(b) by 160 days.

(21) Appl. No.: 10/976,516

(22) Filed: Oct. 29, 2004

Related U.S. Application Data

(60) Provisional application No. 60/533,714, filed on Dec. 30, 2003.

(51) Int. Cl.
*G06F 13/40* (2006.01)
*G06F 13/00* (2006.01)
*H01L 25/00* (2006.01)
*G06F 13/42* (2006.01)

(52) U.S. Cl. .................. 710/104; 710/301; 716/11; 326/101

(58) Field of Classification Search .............. 710/104, 710/300–301; 716/11; 326/101
See application file for complete search history.

(56) References Cited

U.S. PATENT DOCUMENTS

| | | | | |
|---|---|---|---|---|
| 4,443,866 A | * | 4/1984 | Burgiss, Sr. ............ | 710/100 |
| 5,308,926 A | * | 5/1994 | Auerbuch et al. ........ | 174/250 |
| 5,615,106 A | * | 3/1997 | Yoshino et al. .......... | 700/19 |
| 6,174,196 B1 | * | 1/2001 | Pongracz et al. ........ | 439/502 |
| 6,537,109 B1 | * | 3/2003 | Emery ................... | 439/638 |
| 6,629,181 B1 | * | 9/2003 | Alappat et al. .......... | 710/300 |
| 6,913,471 B2 | * | 7/2005 | Smith .................... | 439/74 |
| 2006/0161269 A1 | * | 7/2006 | Staiger .................. | 700/20 |

\* cited by examiner

*Primary Examiner*—Paul R. Myers
*Assistant Examiner*—Ryan M Stiglic
(74) *Attorney, Agent, or Firm*—Martine Penilla & Gencarella, LLP

(57) ABSTRACT

Provided are a method and a system for designing an embedded system using a design process for building a general-purpose computer. Specifically, the embedded system design includes adding and removing add-on cards as needed during the development of the embedded system design. The add-on cards are easily obtainable and connect to a circuit board of the embedded system by selecting lines originating from the circuit board. The lines not selected are passed on to other add-on cards connected to previously connected add-on cards. After all the lines from the circuit board are either selected to connect to logic of the add-on cards or remain unselected, information regarding the add-on cards are used to generate a configuration image. The configuration image is transmitted to a programmable processor of the circuit board to enable communication on the selected lines, thus permitting the embedded system to function.

42 Claims, 11 Drawing Sheets ic cost effective to use than an FPGA once the desired functionality is fixed (an ASIC cannot have its core functionality changed once it is manufactured).

EMBEDDED SYSTEM DESIGN THROUGH SIMPLIFIED ADD-ON CARD CONFIGURATION

CROSS REFERENCE TO RELATED APPLICATIONS

This application claims priority under 35 U.S.C. § 119(e) from U.S. Provisional Patent Application No. 60/533,714, filed on Dec. 30, 2003 and entitled "System and Method for Add-On Card Configuration," which is hereby incorporated by reference in its entirety.

BACKGROUND

1. Field of the Invention

The present invention relates to embedded systems, and more specifically to embedded system design through simplified add-on card configuration.

2. Description of the Related Art

Expandable general-purpose computers typically have an architecture involving a motherboard with add-on cards inserted into available card slots. For example, FIG. 1 is a prior art diagram illustrating a general-purpose computer using card slots 100 to connect add-on cards 110 to a motherboard 120. The architecture of the illustration provides for expanding the basic abilities of the motherboard 120 by adding or removing add-on cards 110 when needed.

The card slots 100 between the motherboard 120 and the add-on cards 110 include a shared bus where address and data information is transferred. For example, FIG. 2 is a prior art diagram illustrating connections of an address bus and a data bus. Each add-on card 110 is assigned a unique address, such as "0001," "0002," and "0003." Thus, data can be transferred over the shared bus to specific add-on cards 110. An exemplary shared bus can include 32 address lines, 32 data lines, and various other control, power, and ground lines for a total of about 70 lines.

General-purpose computers typically have a shared bus architecture to permit adding on various types of functionality. However, on embedded system devices, such as embedded systems in a car, phone, microwave oven, or television, there is no need to provide for adding on various types of functionality. The embedded system devices do not change or expand after initial manufacture. In such embedded system devices, there is generally no or limited need for the shared bus architecture, as circuitry of the embedded system device is directly driven when the wiring of the embedded system device is fixed.

Thus, when designing a computer system, it is important to know whether it is intended for use as a general-purpose computer or to perform some fixed function of an embedded system. For example, the architecture of the general-purpose computer often requires a sophisticated bus, and thus substantial logic between the main processor on the motherboard 120 to the bus, and from the bus, to each add-on card 110. Alternatively, if the computer system functionality is limited, such as in the embedded system, then generally the sophisticated bus is not required.

FIG. 3 is a prior art diagram illustrating connections of a shared bus of add-on cards 110 within a general-purpose computer. Specifically, a bus 310 is shared among the add-on cards 110. A Field-Programmable Gate Array (FPGA) of each add-on card 110 interfaces with the bus 310 to enable communication between the motherboard 120 and the add-on cards 110. Thus, the general-purpose computer can function with any number of add-on cards 110. Further, it is common knowledge that an Application Specific Integrated Circuit (ASIC) can and is often more cost effective to use than an FPGA once the desired functionality is fixed (an ASIC cannot have its core functionality changed once it is manufactured).

However, when developing the embedded system, a circuit board design is prototyped with the majority of the wiring fixed and the specific chips and other components to be included in the design are appropriately wired. The embedded system design process does not include the design process of connecting add-on cards 110, such as in the general-purpose computer. Thus, if there are changes to the circuit board design, then the wiring and layout (the physical location of components and wire routes) of the prototype must be changed. Typically, the prototype wiring is more complex to change than the design of the general-purpose computer. Specifically, add-on cards 110 can be added or removed from card slots 100 of the general-purpose computer while wiring of the embedded system design cannot be easily added or removed.

Accordingly, what is needed is a method and system to develop an embedded system that permits modifications to the embedded system during prototyping without complex wiring changes.

SUMMARY

Embodiments of the present invention provide a method and a system of embedded system design through simplified add-on card configuration. It should be appreciated that the present invention can be implemented in numerous ways, such as a process, an apparatus, a system, a device or a method. Several inventive embodiments of the present invention are described below.

An embodiment of a method of configuring an embedded system includes connecting multiple add-on cards to a circuit board having a programmable processor. The programmable processor is configured to communicate with the multiple add-on cards through selected ones of multiple lines. The method also includes connecting the selected ones of the multiple lines to logic of the multiple add-on cards. Unselected ones of the multiple lines are passed on from one of the multiple add-on cards to another of the multiple add-on cards. Further, the method includes determining an identifier of each of the multiple add-on cards, the multiple add-on cards having a sequence, such that the sequence and the identifier of each of the multiple add-on cards are used to generate a configuration image. The method also includes configuring the programmable processor to communicate with the multiple add-on cards through the selected ones of the multiple lines by obtaining the configuration image.

An embodiment of an embedded system includes a programmable processor connected to a circuit board. The programmable processor is configured to receive a configuration image. The configuration image enables the operation of selected ones of multiple lines. Further, the embedded system includes sequenced multiple add-on cards. Each of the sequenced multiple add-on cards have an identifier used for generating the configuration image. The sequenced multiple add-on cards are connected to the programmable processor through the selected ones of the multiple lines, such that the selected ones of the multiple lines enable communication between the sequenced multiple add-on cards and the programmable processor. Further, the embedded system includes logic of each of the sequenced multiple add-on cards connected to the selected ones of the multiple lines, such that unselected ones of the multiple lines are passed on from one of the sequenced multiple add-on cards to another of the sequenced multiple add-on cards.

In an embodiment of an embedded system, the embedded system includes means for determining a configuration image. The configuration image is associated with identifiers of sequenced multiple add-on cards. The embedded system also includes means for connecting the sequenced multiple add-on cards to a circuit board with a programmable processor. The programmable processor is in communication with the sequenced multiple add-on cards through selected ones of multiple lines. Further, the programmable processor is configured to use the configuration image to establish communication with the sequenced multiple add-on cards, such that unselected ones of the multiple lines are passed from one of the multiple add-on cards to another of the multiple add-on cards.

In still another embodiment, a method for embedded system design is provided. The method includes providing a programmable processor on a circuit board, where the programmable processor is communicating through a set of pins. An add-on card is coupled to the circuit board to enable connection to the programmable processor, where the add-on card is using one or more of the set of pins. Then, passing through any of the set of pins not used by the add-on card to a next add-on card that can be connected to the add-on card. Each pin of the set of pins from the programmable processor is directly linked to card logic of each of the add-on card and the next add-on card. In a next operation, an identifier, a sequence and an orientation of each of the add-on card and the next add-on card is determined. Once this information is determined, a configuration image is generated for the connected add-on card and the next add-on card. The configuration image is capable of being stored on temporary memory of the programmable processor, and the configuration image enables functional communication between the programmable processor and each of the add-on card and the next add-on card.

Other aspects of the invention will become apparent from the following detailed description taken in conjunction with the accompanying drawings, which illustrates by way of example, the principles of the invention.

BRIEF DESCRIPTION OF THE DRAWINGS

Embodiments of the present invention, together with other aspects thereof, may best be understood by reference to the following description taken in conjunction with the accompanying drawings in which.

DETAILED DESCRIPTION

Embodiments of the present invention include a method and system for an embedded system design using configurations of add-on cards of a general-purpose computer. Specifically, instead of creating a prototype of an embedded system with complex wiring that may be discarded if changed, a prototype of the embedded system can be designed by adding commercially available cards to a circuit board, which is refined into a particular form factor. The particular form factor can be any hardware such as a mobile telephone, Personal Digital Assistant (PDA), television, printer, or other suitable device having a specific function.

During the development of the prototype of the embedded system using the general-purpose computer, add-on cards can be added and removed as needed without affecting complex wiring. The ease of adding and removing add-on cards without affecting complex wiring is defined as simplified add-on card configuration. Thus, the embedded system design is obtained through simplified add-on card configuration. However, it will be obvious to one skilled in the art that the present invention may be practiced without some or all of these specific details. In other instances, well known process operations have not been described in detail in order not to unnecessarily obscure the present invention.

Figure 1:
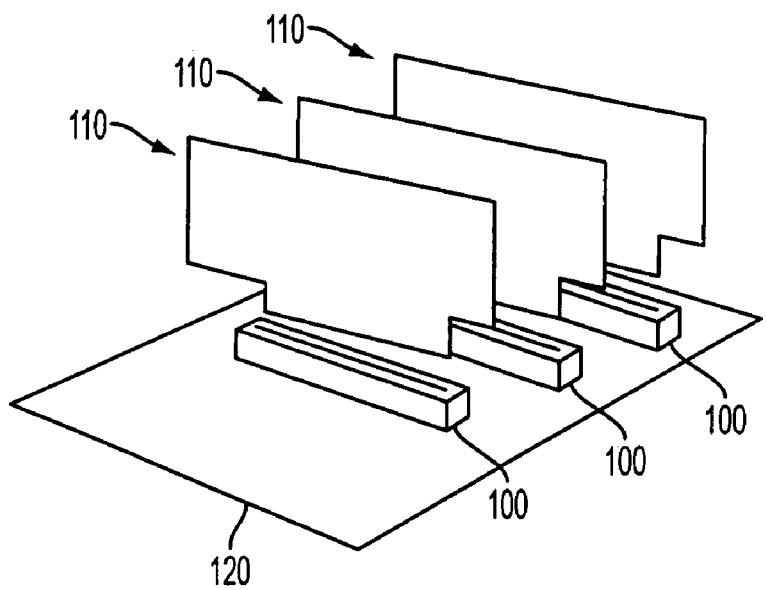
FIG. 1 is a prior art diagram illustrating a computer using card slots to connect add-on cards to a motherboard.
Figure 2:
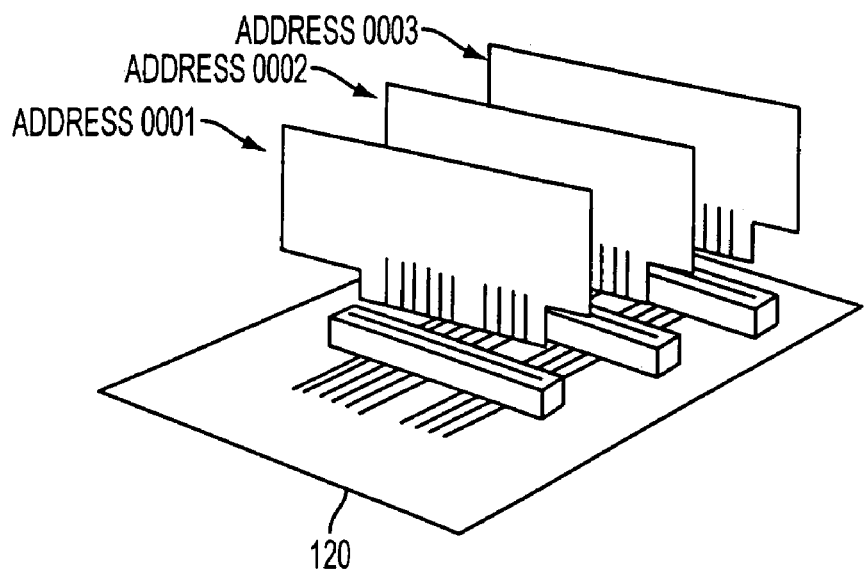
FIG. 2 is a prior art diagram illustrating connections of an address bus and a data bus.
Figure 3:
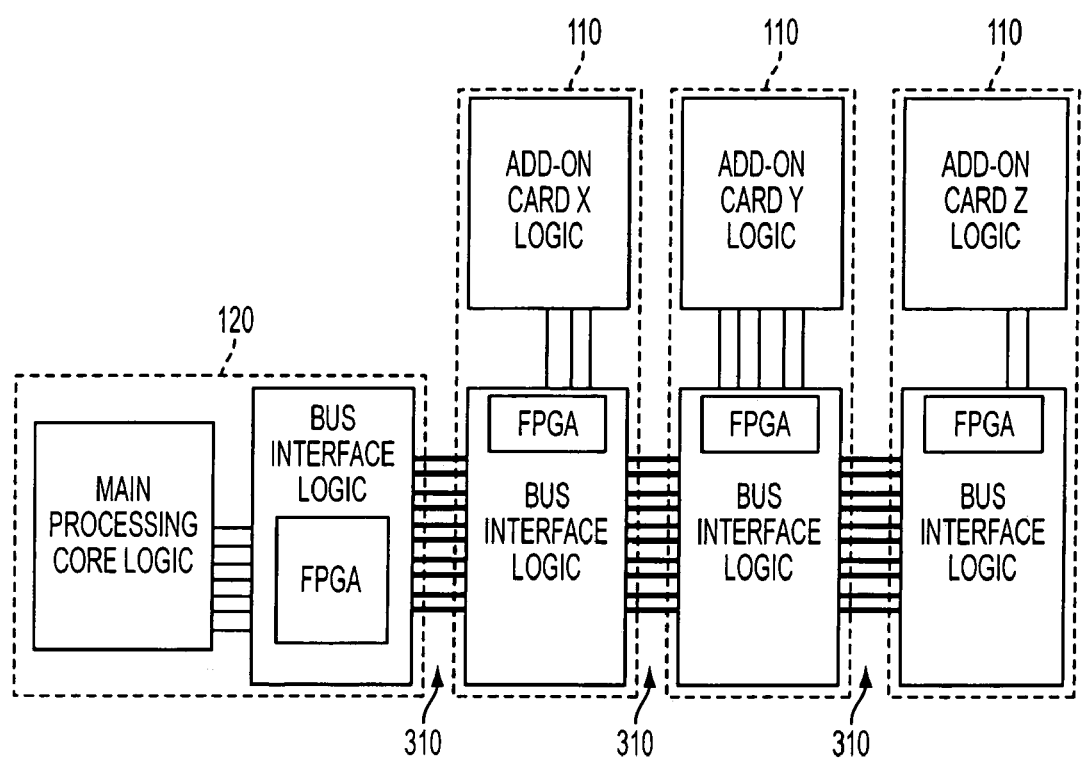
FIG. 3 is a prior art diagram illustrating connections of a shared bus of add-on cards within a general-purpose computer.
Figure 4:
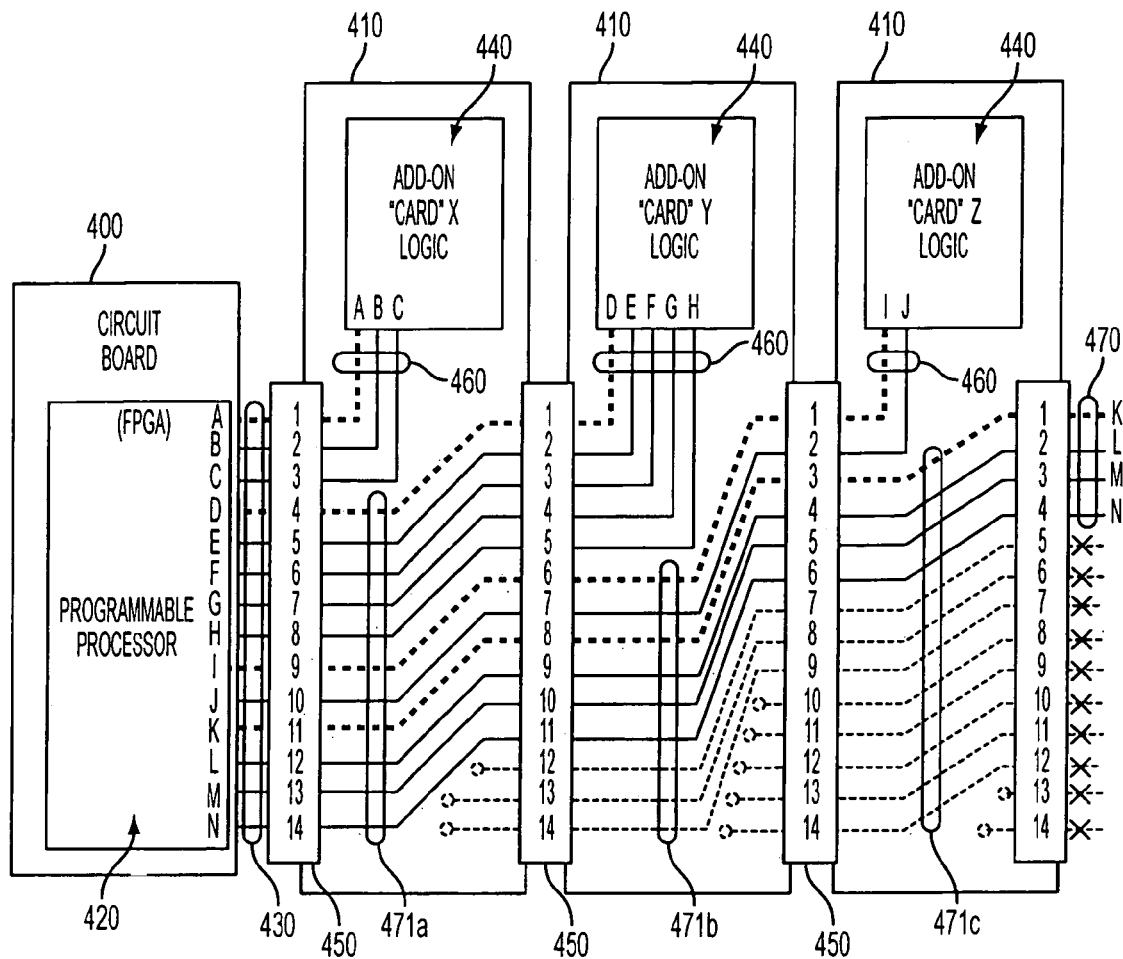
FIG. 4 is a diagram illustrating a circuit board and add-on cards, in accordance with an embodiment of the present invention.

FIG. 4 is a diagram illustrating a circuit board 400 and add-on cards 410, in accordance with an embodiment of the present invention. The circuit board 400 includes at least one configuration processor 509 (not shown) and a programmable processor 420. The programmable processor 420 is in communication with the add-on cards 410 to perform the functions of the embedded system. To those of ordinary skill in the art, the configuration and programmable processors includes logic units capable of performing calculations on data and storage for the data. However, before the programmable processor 420 can interact with the add-on cards 410, it must be appropriately configured. It is the role of the configuration processor to detect the attached add-on cards 410 and obtain the proper configuration information required by the programmable processor 420 to enable its communication to the add-on cards 410. Specifically, the programmable processor 420 is configured to communicate with multiple add-on cards 410 through multiple lines 430. For example, a Field Programmable Gate Array (FPGA) or other suitable processor capable of being configured, is connected to multiple lines 430, such as lines A through N that originate at the programmable processor 420. It should be appreciated that any number of lines are possible, as long as the lines enable communication between the programmable processor 420 and the multiple add-on cards 410. The multiple lines 430 terminate at logic 440 of the add-cards 410 or the last card of a sequence of add-on cards 410.

Each of the add-on cards 410 can be any suitable off-the-shelf add-on card that is commercially available. For example, a catalog (not shown) of any computer parts supplier can illustrate an add-on card 410 for processing video data or processing encrypted data. Thus, any add-on card 410 that can perform any function of the embedded system can be acquired. After acquiring the add-on cards 410, the add-on cards 410 are ordered in a sequence and connected to each other. The first add-on card 410 of the sequence is connected to the circuit board 400 through connectors 450.

The connectors 450 enable the add-on cards 410 to connect to the multiple lines 430 originating from the programmable processor 420. In particular, the closest connector 450 of the add-on card 410 to the circuit board 400 is defined as an IN connector. In contrast, the farthest connector 450 of the add-on card 410 from the circuit board 400 is defined as an OUT connector. Thus, multiple lines 430 can enter the IN connector of an add-card 410 and exit the OUT connector of the add-on card 410. Any of the multiple lines 430 used by the add-on card 410 are defined as selected lines 460 and any of the multiple lines 430 unused by the add-on card 410 are passed from one add-on card 410 to another add-on card 410. Lines 471a–471c are unselected and unused lines that are passed forward. Unused lines 470 are those provided by the programmable processor 420 which are not used by any add-on card 410.

In one exemplary embodiment, each add-on card 410 selects as many multiple lines 430 as required from the IN connector and passes unselected lines 471a, 471b and 471c forward. In the illustrated example of FIG. 4, lines 4–14 on the left connector of card X are pass-forward unselected lines 471a, lines 6–14 of the left connector of card Y are pass-forward unselected lines 471b, and lines 3–14 of the left connector of card Z are pass-forward unselected lines 471c. In this example, lines K–N are unused lines 470. As no additional add-on cards 410 are shown connected, unselected lines 470 are unnecessary lines. Consequently, for each add-on card 410 that is connected, the lines that were not used by the particular connector are passed through to the OUT connector, shifting the unselected lines forward and making them available for selection by the next add-in card 410. The concept of shifting unselected lines from the IN to the OUT connector on an add-on card 410 involves the use of a standard line allocation scheme by which a set of selected lines 460 are allocated from those 430 presented to an IN connector.

The unselected lines, for example 471a, are then shifted and routed to the OUT connector so that another add-on card attached to this OUT connector can allocate its own selected lines 460. The role of the standard line allocation scheme is to order lines 430 such that it is always known which lines have a higher likelihood of providing a path back to the programmable processor 420 versus lines that do not because they are used by other add-on cards to communicate with the programmable processor 420. The process of allocating incoming lines (on the IN connector) for use on an add-on card 420 transitions the selected lines 460 on the IN connector to no longer, for any subsequently attached add-on card, providing a path back to the programmable processor 420. Since the selected lines 460 were allocated from those 430 most likely to provide a path back to the programmable processor 420, the remaining unselected lines are shifted and pass-forward to the OUT connector as those now most likely to provide a path back to the programmable processor. In the current example, lines are allocated from the lowest pin numbers, starting with pin 1. The add-on card X takes lines A, B, and C from the IN connector's pins 1, 2, and 3 and then pass-forwards the unselected lines D through N (471a) to its OUT connector where D is shifted to the OUT connector's pin 1, E is shifted to the OUT connector's pin 2, and so on.

Continuing with the same example of FIG. 4, multiple lines 430 are selected starting from pin 1 of the IN connector. After lines A, B, and C are selected on a first add-on card 410, line D is passed to a second add-on card 410 and is available for selection at pin 1 of the IN connector of the second add-on card 410. Thus, as each new add-on card 410 is plugged into the currently connected add-on card 410, the number of available lines that connect to the circuit board 400 is reduced. As multiple lines 430 are selected, an equal number of multiple lines 430 become "no connects" on the OUT connector. At the start, all connects for the IN connector of the first add-on card 410 are usable. For the IN connector of the second add-on card 410, only pins 12–14 are no connects. For the IN connector of the third add-on card 410, only pins 7–14 are no connects. If a fourth add-in card had been connected in the example of FIG. 4, then the IN connector of the fourth add-on card 410 would have seen pins 5–14 as no connects. Thus, a fourth add-on card would be limited to pins 1–4. Of course, the connector having 14 pins is only an example, and connectors can be implemented having any number of pins depending on the target implementation.

Ultimately, the no connects of the farthest OUT connector from the circuit board 400 are not driven so as not to cause problems if an add-on card 410 improperly attempts to utilize the no connects. One of ordinary skill will recognize that an undriven or tri-stated line is not driven or read. Logic utilizing selected lines 460 must allow for the case where the lines are in an undriven or tri-stated state (awaiting configuration). Further, multiple lines 430 that are not selected for use by any add-on card 410 defined as an unnecessary lines. Thus, in one exemplary embodiment illustrated by FIG. 4, the unnecessary lines K, L, M, and N can be eliminated when the embedded system design is completed and refined to conform to a device having a particular form factor.

The signals propagated through multiple lines 430 A through N are not limited. For example, the multiple lines 430 can be digital lines, analog lines, inputs, or outputs. However, the multiple lines 430 can be configured to match the logic 440 of the add-on cards 410 to which the multiple lines 430 are routed when selected. In an embodiment of the present invention, the selected lines 460 are fully functional after the programmable processor 420 receives a configuration image that is generated based on a unique identifier of each add-on card 410 and the sequence of the add-on cards 410. Details of the generation of the configuration image will be described in more detail in reference to FIG. 11.

It is emphasized that without limitation, logic 440 of each add-on card 410 can perform any logic function required by an embedded system. Consequently, as the examples are too many and infinitely encompassing, the following example functions of (a) activating a Light Emitting Diode (LED), (b) processing images, (c) processing sound, (d) encrypting data, etc., are given to provide some context into the arbitrary types of logical functions that can be envisioned.

Figure 5:
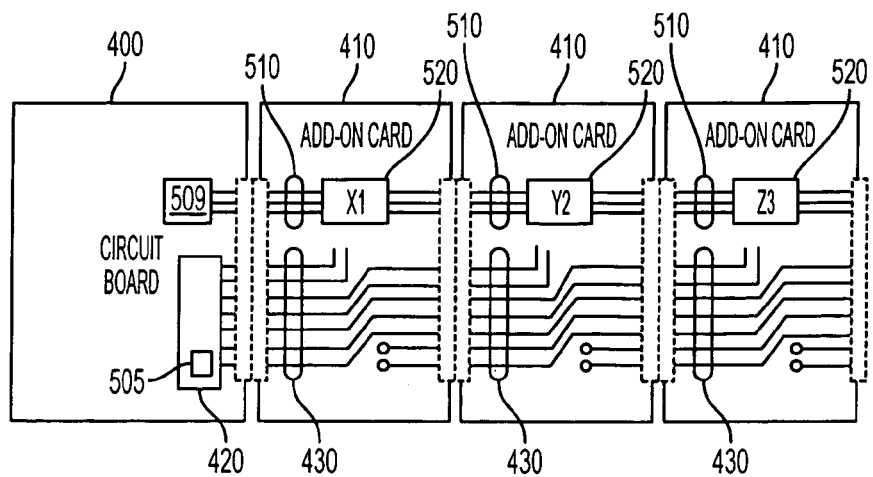
FIG. 5 is a diagram illustrating an embedded system design including configuration lines, in accordance with an embodiment of the present invention.

FIG. 5 is a diagram illustrating an embedded system design including configuration lines 510, in accordance with an embodiment of the present invention. Specifically, the configuration lines 510 originate from the circuit board 400 to connect to the multiple add-on cards 410. The configuration lines 510 enable the determination of identifiers of the multiple add-on cards 410. For example, as illustrated in FIG. 5, the closest add-on card 410 has configuration logic 520 including an identifier X1. The next add-on card 410 has an identifier Y2 and the farthest add-on card 410 from the circuit board 400 has an identifier Z3. It should be appreciated that the identifiers are unique to at least each type of add-on card 410. The add-on card logic 440 is not shown in FIG. 5. Further, an embedded design may include more than one of any type of add-on card. Such cards are uniquely identified by their order in the sequence along with their identifier (which may be identical if dealing with the same type of add-on card). Further, although the identifier can be determined from the configuration logic 520, other embodiments of the present invention can include physical labeling on the add-on card 410 to identify the card. In such embodiments, the configuration lines 510 are not needed to determine the identifiers or the order of the add-on cards 410.

During the determination of the identifiers of the add-on cards 410, the configuration processor 509 of the circuit board 400 interrogates each configuration logic 520 to determine the identifiers and board orientation by using the configuration lines 510. During the interrogation, the order of the identifiers is also determined and thus, the type, sequence, and orientation of the add-on cards 410 is determined. The sequence of the add-on cards 410 is the order of the add-on cards 410 connected to the circuit board 400 defined between a first add-on card 410 connected to the circuit board 400 to a last add-on card 410 of the sequence. Thus, as illustrated in FIG. 5, the exemplary sequence of the add-on cards is X1, Y2, and Z3. However, it should be appreciated that any suitable sequence is possible, as long as the order of the add-on cards 410 is determined by the embedded system design.

The interrogation of the add-on cards 410 also includes reading information from the add-on cards 410, such as the technical specifications of the add-on cards 410. Alternatively, after determining the identifiers, the technical specifications can be obtained by accessing the Internet. The interrogation can also verify that the add-on cards 410 are compatible with the circuit board 400, verify that the add-on cards 410 are compatible with one another, and validate any order requirements of the add-on cards 410. For example, high-speed add-on cards 410 may need to be attached before lower speed add-on cards 410. Further, the interrogation also validates any maximum line distance from the circuit board 400 to an add-on card 410, validates that the circuit board 400 power supply is capable of driving all the add-on cards 110, and determines voltage/power requirements for the add-on cards 410.

Figure 6:
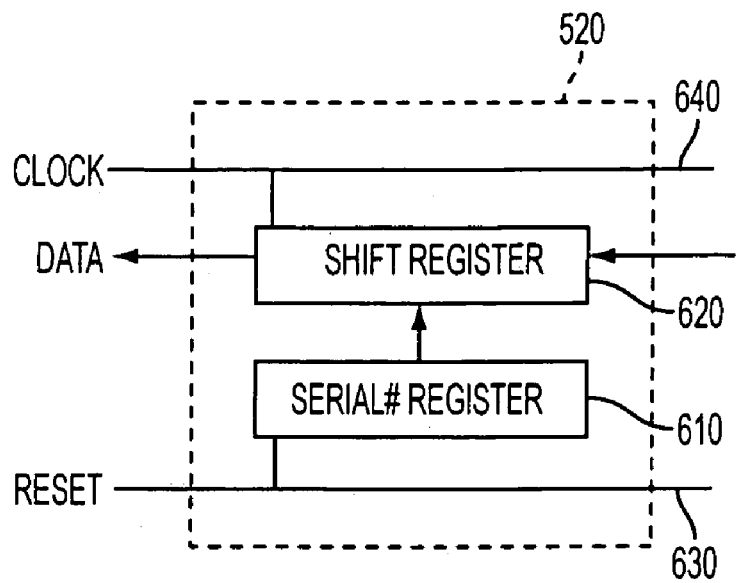
FIG. 6 is a diagram illustrating configuration logic, in accordance with an embodiment of the present invention.

FIG. 6 is a diagram illustrating the configuration logic 520, in accordance with an embodiment of the present invention. In an exemplary embodiment, the configuration logic 520 includes a serial number stored in a register 610. Upon reset, which occurs when driving the reset line 630, the serial number is loaded into a shift register 620. Data output from the shift register 620 can be the input to the shift register 620 of the next add-on card 410 towards the direction of the circuit board 400. The configuration processor 509 (not shown) of the circuit board 400 can drive a clock line 640 to read out all the serial numbers and board orientations one after another, with zeroes occurring after the last add-on card 410. Thereafter, information associated with each add-on card 410 serial number can be determined. In another embodiment for determining the identifier, Joint Test Action Group (JTAG) processors can be implemented to support similar functions as the configuration logic 520. It should be appreciated that the identifiers determined during the interrogation can be a serial and/or model number, or include states read from jumpers, or a Uniform Resource Locator (URL) address. Further, although power and ground lines are not shown, it should be appreciated that some of the power lines can be configurable. Thus, the circuit board 400 can detect certain power requirements of some add-on cards 410 and route the power through one or more shared power lines. Accordingly, a powering system for the add-on cards 410 can consist of a ground and a pre-defined voltage (e.g. about 3.3 volts), and voltage configurable power lines.

Figure 7:
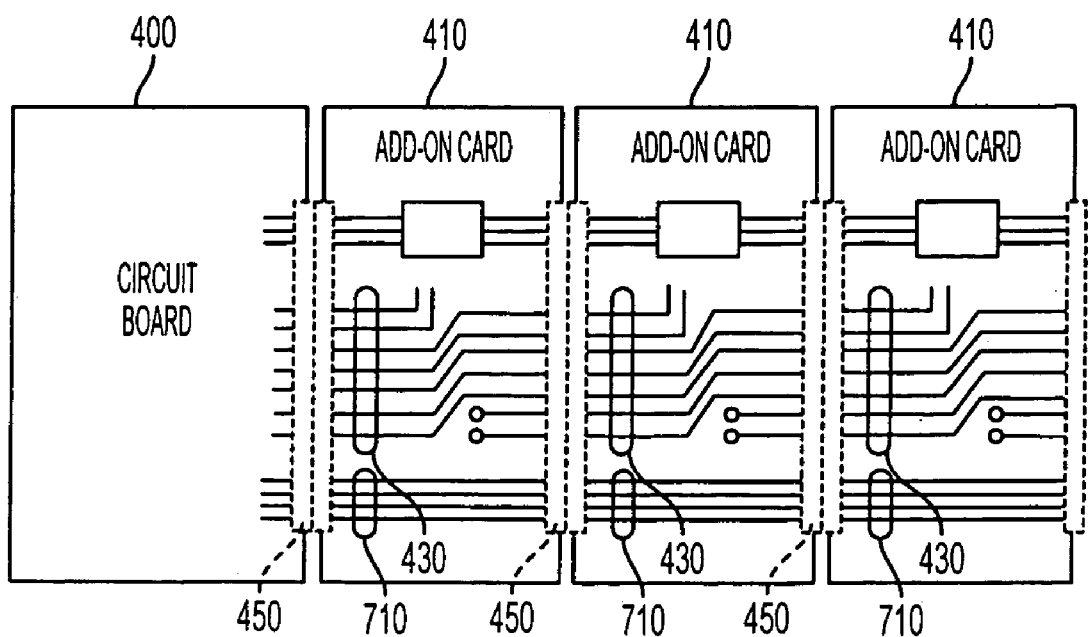
FIG. 7 is a diagram illustrating shared data bus lines, in accordance with an embodiment of the present invention.

FIG. 7 is a diagram illustrating shared data bus lines 710, in accordance with an embodiment of the present invention. In one exemplary embodiment, shared data bus lines 710 originate from the circuit board 400. While the selected multiple lines 430 are used for logic 440 (not shown) communication, the shared data bus lines 710 provide the ability to transfer data among all the add-on cards 410. However, it should be appreciated that the shared data bus lines 710 are optional and need not be included in the embedded system design. To implement the shared data bus lines 710, for example, if the connector 450 of the add-on card 410 includes 180 pins, then using 16 pins for a shared data bus line 710 to transfer 16 bits would leave 164 pins for use as the multiple lines 430.

Figure 8:
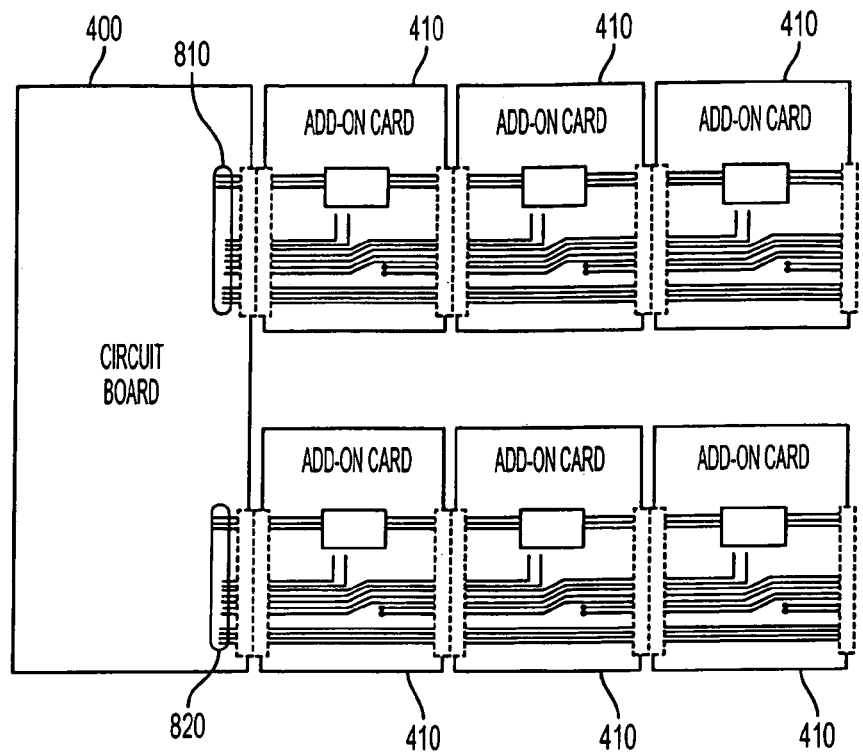
FIG. 8 is a diagram illustrating an upper connector system and a lower connector system, in accordance with an embodiment of the present invention.

FIG. 8 is a diagram illustrating an upper connector system 810 and a lower connector system 820, in accordance with an embodiment of the present invention. In an exemplary embodiment, by providing two or more connector systems from the circuit board 400, multiple add-on cards 410 can be connected. For example, the upper connector system 810 can connect multiple add-on cards 410 through a first wing to enable communication with the programmable processor 420 (not shown). Similarly, the lower connector system 820 can connect multiple add-on cards 410 through a second wing to enable communication with the programmable processor 420. It should be appreciated that although the upper connector system 810 and the lower connector system 820 can be connected to one programmable processor 420, other embodiments can have any number of programmable processors 420. For example, the upper connector system 810 and the lower connector system 820 can each be connected to a separate programmable processor 420 (shown in FIG. 4). Thus, the embedded system design can include any number of wings, as long as at least one programmable processor 420 communicates with the add-on cards 410 connected on the wings.

Figure 9:
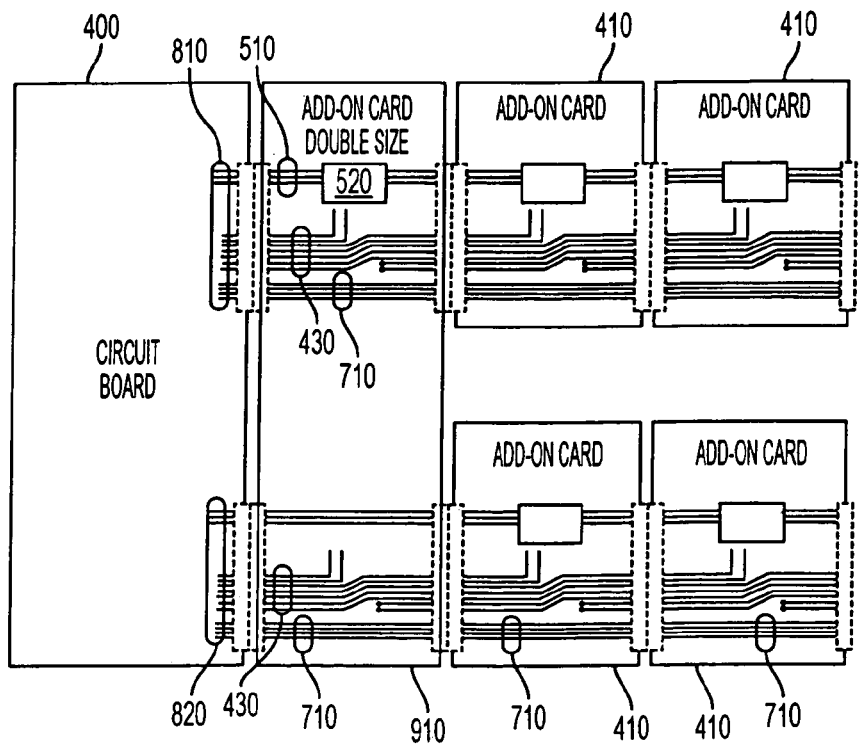
FIG. 9 is a diagram illustrating a circuit board connected to a double size add-on card, in accordance with an embodiment of the present invention.

FIG. 9 is a diagram illustrating the circuit board 400 connected to a double size add-on card 910, in accordance with an embodiment of the present invention. Instead of connecting multiple add-on cards 410 to the upper connector system 810 and the lower connector system 820, the double size add-on card 910 can be connected to the circuit board 400. Thus, by providing multiple connector systems, the circuit board 400 can accommodate any size add-on card acquired for the embedded system design. The double size add-on card 910 has one identifier that may be stored in configuration logic 520. Thus, only one set of configuration lines 510 is connected to the configuration logic 520 for performing the interrogation process described above. Further, the double size add-on card 910, in addition to using twice as many multiple lines 430 as one add-on card 410, it can use two sets of the shared data bus lines 710. For example, while the add-on card 410 can support a 16-bit shared data bus, the double size add-on card 910 can support a 32-bit shared data bus. The data for a 32-bit shared data bus can be transferred in parallel using the two sets of shared data bus lines 710 of the double size add-on card 910.

Figure 10:
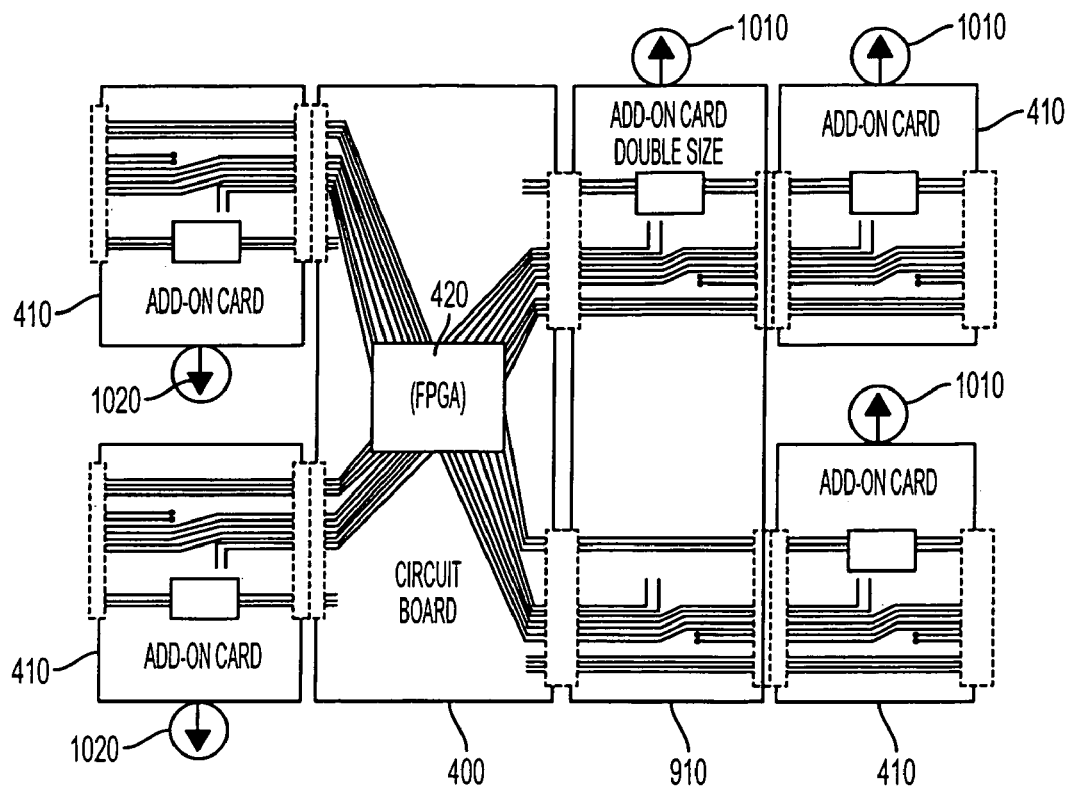
FIG. 10 is a diagram illustrating a circuit board with a quad add-on card connector system, in accordance with an embodiment of the present invention.

FIG. 10 is a diagram illustrating the circuit board 400 with a quad add-on card connector system, in accordance with an embodiment of the present invention. In yet another embodiment, the circuit board 400 can support four wings of add-on cards 410. For example, the programmable processor 420 can communicate with multiple add-on cards 410 and a double size add-on card 910. By providing more connector systems from the circuit board 400, the average line length of the multiple lines 430 is reduced. Alternatively, without the multiple connector systems, all the add-on cards may be connected using only two connector systems, thus increasing the length of the multiple lines 430 from the programmable processor 420 to the multiple add-on cards. Thus, the total signal path length can be minimized using connector systems, and therefore this can lead to the faster propagation of signals.

If using the quad add-on card connector system, it should be appreciated that add-on cards 410 connected on opposite sides of the circuit board 400 have opposite directions. For example, the double size add-on card 910 and the add-on cards 410 on one side of the circuit board have a direction 1010. The direction 1010 indicates that the IN connectors of the add-on cards are connected to the circuit board 400. Alternatively, on the opposite side of the circuit board 400, the add-on cards 410 have a direction 1020. The direction 1020 also indicates that the IN connectors of the add-on cards 410 are connected to the circuit board 400.

Figure 11:
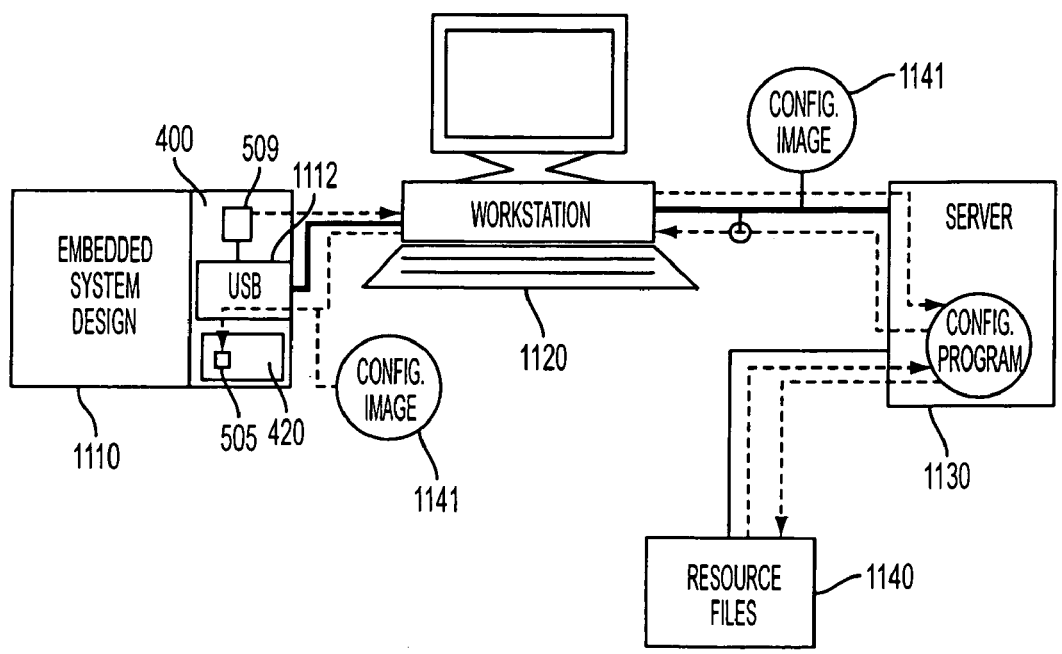
FIG. 11 is a diagram illustrating an embodiment of an embedded system development environment operating a configuration program, in accordance with an embodiment of the present invention.

FIG. 11 is a diagram illustrating an embodiment of an embedded system development environment operating a configuration program, in accordance with an embodiment of the present invention. For example, an embedded system design 1110 can be in communication with a workstation 1120 and a server 1130. Although FIG. 11 illustrates wired connections, it should be appreciated that the connections can be wireless. If a wire-based connection exists, then a universal serial bus (USB) of the embedded system design 1110 can provide a port for the wire-based connection. However, any suitable port for a wire-based connection is possible, as long as the embedded system design 1110 can communicate with the configuration program operating on a device of the embedded system development environment.

Specifically, the configuration program can operate on the server 1130. However, although the configuration program can operate on the server 1130 or the workstation 1120, any computing system device accessible to the embedded system design 1110 through a network can operate the configuration program. After the configuration processor 509 of the circuit board 400 (also see FIG. 4) determines the identifiers, an orientation (if rotation is present in one or more add-on cards) and the sequence of the add-on cards 410, the configuration program on the server 1130 accesses resource files 1140 for data corresponding to the identifiers. The configuration program is configured to compile data, (e.g., including data obtained from the resource files 1140). The compiling of the data therefore produces a configuration image 1141 that is communicated back to the USB 1112. Through the USB 1112, the configuration image 1141 is stored in temporary memory 505 (e.g., flash memory) of the programmable processor 420 (e.g., FPGA). At this point, the programmable processor 420 can be turned ON, using the configuration image 1141 that enables proper signal and electrical communication between the programmable processor 420 (e.g., FPGA) and the logic of each add-on card. Thus, the programmable processor 420 receives the configuration image and consequently, the programmable processor 420 can communicate with the add-on cards 410 over the selected lines 460.

Along with the configuration image, data can be provided by the configuration program that can include settings of the add-on cards, operating system drivers enabling the software running on the circuit board 400 to communicate with the add-on cards 410, and any other software enabling the embedded system to function. Once a configuration image for the programmable processor 420 has been determined, that enables the embedded system to function, the embedded system design 1110 can be adjusted to conform to a particular form factor. Exemplary form factors include devices such as PDAs, mobile phones, microwaves, devices in automobiles, etc. Accordingly, hand-held and non-handheld devices can include the embedded system design 1110.

Figure 12:
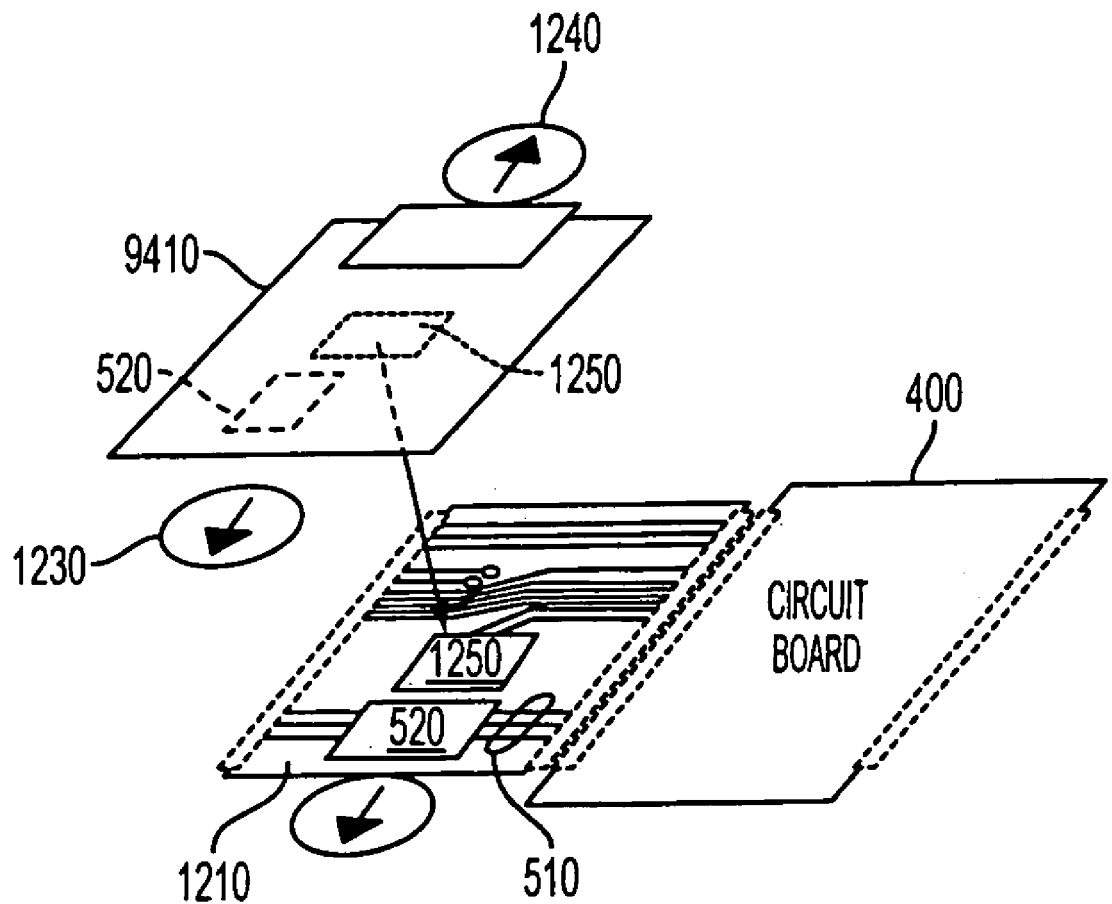
FIG. 12 is a diagram illustrating an add-on card board pair showing an add-on card and a bottom card, in accordance with an embodiment of the present invention.

FIG. 12 is a diagram illustrating an add-on card 410 made up of a board pair where there is a top card 9410 and a bottom card 1210, in accordance with an embodiment of the present invention. In this embodiment, the functionality of a single-card add-on card 410 is split between the top 9410 and bottom 1210 cards of the board pair. The board pair has a pair connector 1250 located at corresponding locations on the top card 9410 and the bottom card 1210 with functions divided as follows: the lower card contains the IN and OUT connectors and the routing wherein unselected lines are passed from the IN to the OUT connector. The selected lines 460 pass through the pair connector 1250, which is a non-polarized connector, to the top card 9410. Thus, the top card is where the add-on card's logic 440 and associated connectors are located. The reason for providing for the rotation of the top card is to deal with the add-on card's external connector orientation. To illustrate the problem that may be encountered, reference is now drawn to FIG. 10. In FIG. 10, the bottom right add-on card 410 has its connector facing up, directly where another add-on card 410 is located. If a connector is needed to interface with an external system, then the add-on card 410 on the top right would be in the way of the bottom right add-on card 410.

These connectors to interface the embedded system to external systems may include connectors that interface with external systems such as a printer, an Ethernet network, etc. Consequently, if rotation is possible, it would be possible to provide an add-on card board pair (of FIG. 12), to avoid having connectors facing each other, or facing in directions that make connections to external systems difficult, from the physical orientation point of view.

In the example of FIG. 12, bottom card 1210 is shown to include configuration logic 520. If configuration logic 520 is provided on the bottom card 1210, then the bottom card 1210 will be paired up with a particular type of top card 9410, which is designed to interface with the bottom card 1210. In this case, each unique top card 9410 will have to be paired up with a matching bottom card 1210. In practice, this is possible, but for each top card 9410, a matching bottom card 1210 will have to be provided, as only a particular bottom card 1210 will work with the top card, since the configuration logic 520 (which has the card ID) is on the bottom card 1210.

Figure 13:
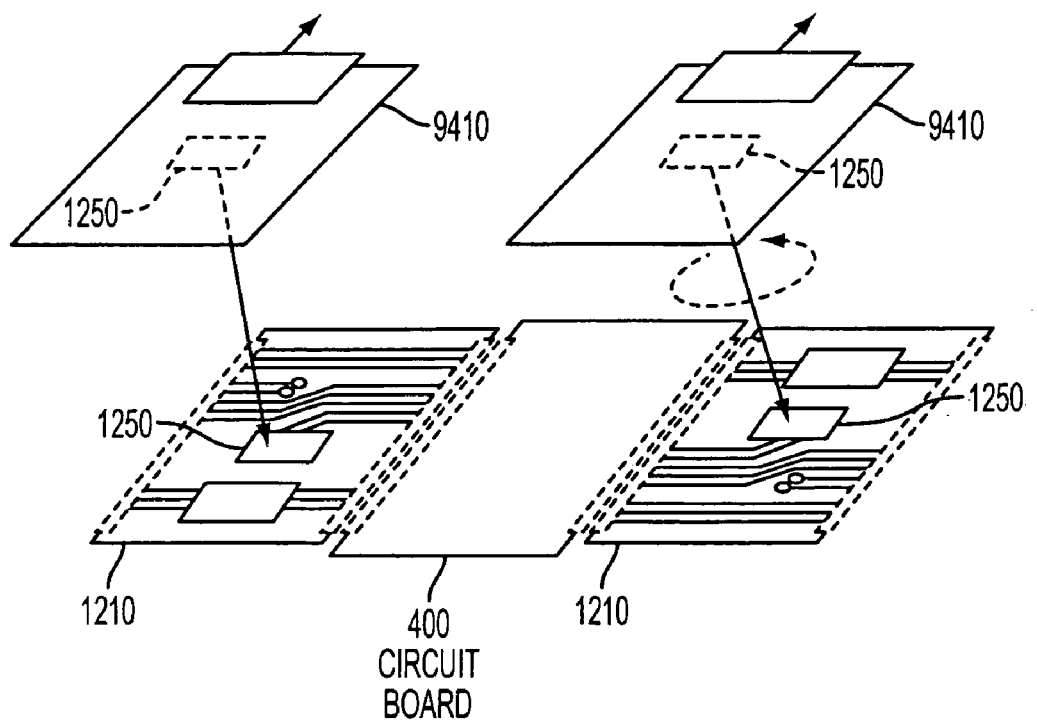
FIG. 13 is a diagram illustrating an add-on card rotated with respect to a bottom card, in accordance with an embodiment of the present invention.

Alternatively, the configuration logic 520 can be placed only on the top card 9410 (shown by a dashed box 520). In such a case, the configuration logic 520 of the bottom card 1210 would be eliminated, and the configuration lines 510 would be routed up to the top cad through the pair connector 1250. Thus, it will be appreciated that the board pair of FIG. 12 can be used to replace any add-on card 410. And, by using the board pair of FIG. 12, the top card can be directionally positioned to face up or down, depending on where the card sits on the line of interconnected add-on cards 410. In this example, without the board pair, the direction 1230 would be fixed. However, with the board pair, a direction 1240 can be obtained. FIG. 13 further illustrates the benefit of being able to rotate the top card in any direction. No matter what the direction of the bottom card 1210 might be, the top card 9410 can be pointed in either the top or bottom directions, thus avoiding conflicts with the physical external connectors of the multiple add-on cards 410 or simply providing a desired orientation.

Depending on the resulting orientation, the information about the orientation of each particular add-on card 410 should be passed back to the configuration program, along with the add-on card's identifier and sequence.

Figure 14:
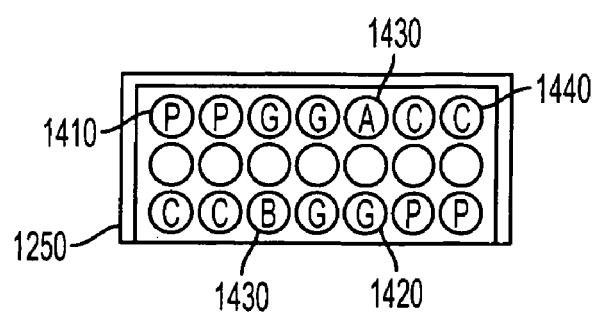
FIG. 14 is a diagram illustrating a pair connector of an add-on card board pair, in accordance with an embodiment of the present invention.

FIG. 14 is a diagram illustrating the pair connector 1250 of an add-on card board pair, in accordance with an embodiment of the present invention. In an exemplary embodiment, the pair connector 1250 is non-polarized so that a mating connector (not shown) can be inserted in either of two directions. The directions (not shown) are either facing down or up. Power lines 1410 and ground lines 1420 are mirrored so that regardless of the orientation in which the mating connector is inserted, the power lines 1410 are connected to power, and the ground lines 1420 are connected to ground. However, two other sense lines 1430 are provided so the orientation of the add-on card 410 can be determined. The number of configuration lines 1440, which correspond to the number of configuration lines 510 (FIG. 5) for the interrogation process, are rounded up to an even number and also mirrored, where the design of the configuration lines and supporting logic can operate in either orientation. Similarly, the shared data lines 710 (FIG. 7) are mirrored. By mirroring the lines, regardless of how the mating connector is inserted, all these lines are routed to the appropriate logic and adjustments can be made for the different orientations.

The multiple lines 430 connect point-to-point between the programmable processor 420 and circuitry of the add-on card's top card 9410 of the board pair. On power up, using the configuration lines 510, each add-on board pair can report the type of the add-on card 410 and orientation. Thereafter, the information is used to generate the configuration image. It should be appreciated that although the add-on card board pair is illustrated with an about 180 degree rotation, rotations of about 90 degrees using a non-polarized square connector are possible.

Figure 15:
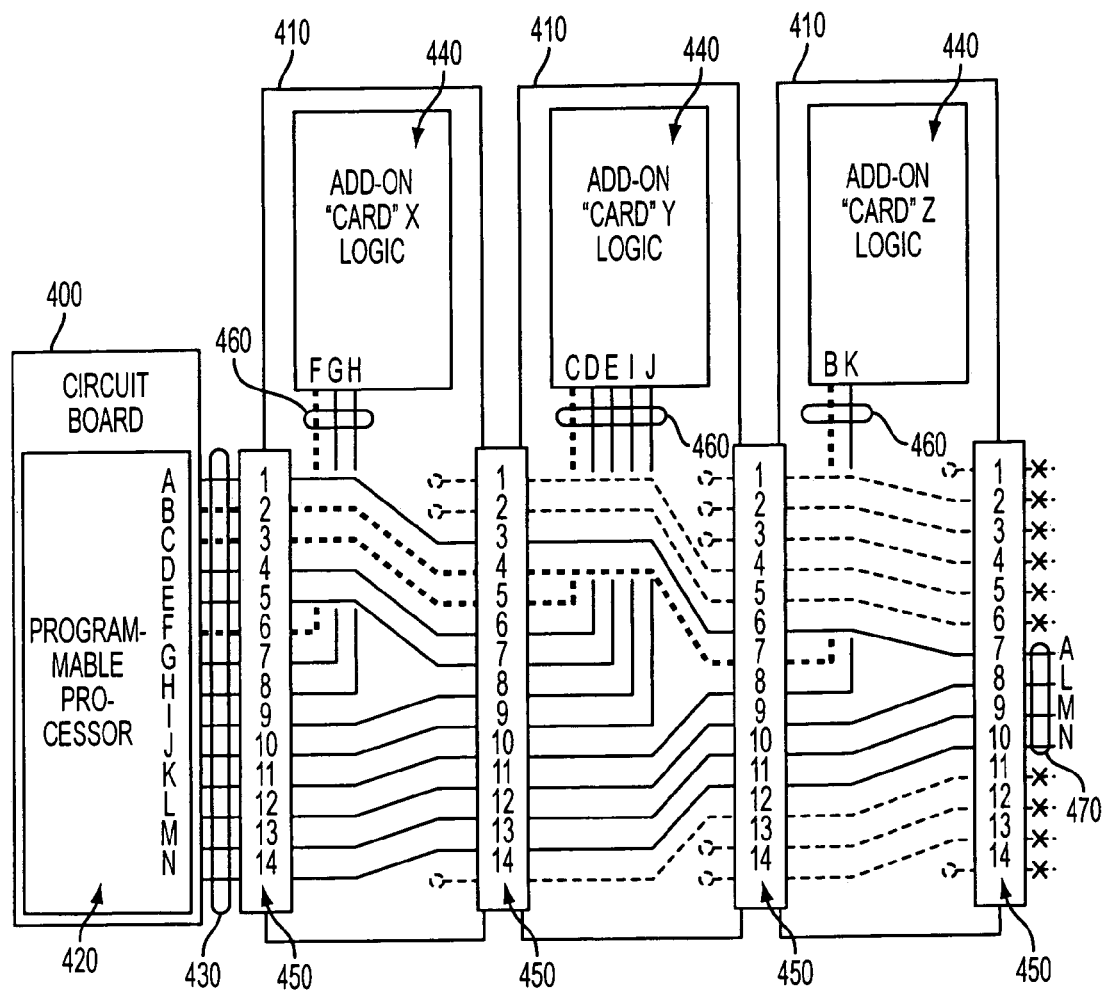
FIG. 15 is a diagram illustrating lines being connected to logic of add-on cards from the center of the lines from a programmable processor, in accordance with an embodiment of the present invention.

FIG. 15 is a diagram illustrating lines being connected to the logic 440 of the add-on cards 410 from particular center lines of the programmable processor 420, in accordance with an embodiment of the present invention. In an exemplary embodiment, FIG. 15 illustrates how lines can be selected from the center pins of the connector 450 instead of from the lowest pin numbers, starting with pin 1, as done in the prior examples. Selecting lines from the center pins is useful if the connector 1250 is located near the center of the add-on card board pair 1250 and 9410. Of course, it should be appreciated that the pair connector 1250 need not be located near the center of the add-on card 410 in other exemplary embodiments, but can be located at other locations of the add-on card 410.

Thus, as illustrated in FIG. 15, lines F, G, and H can be the selected lines 460 for logic X, enabling communication between logic X and the programmable processor 420. Here, the lines F, G, and H are selected from the near center pins 6, 7, and 8 from the IN connector of the add-on card with logic X. Similarly, logic Y uses selected lines 460 for lines C, D, E, I, and J. These selected lines 460 are selected from the near center pins 6, 7, 8, 9, and 10 of the IN connector of the add-on card with logic Y. Finally, referring to the exemplary illustration, the selected lines 460 for lines B and K are selected from the near center pins 7 and 8 of the IN connector of the add-on card with logic Z. In other exemplary embodiments, the bottom pins such as 10 through 14 can provide the lines for selection. Thus, any method of selecting lines (standard line allocation scheme) is possible, as long as the selected lines enable communication between the logic 440 of the add-on card 410 and the programmable processor 420.

Figure 16:
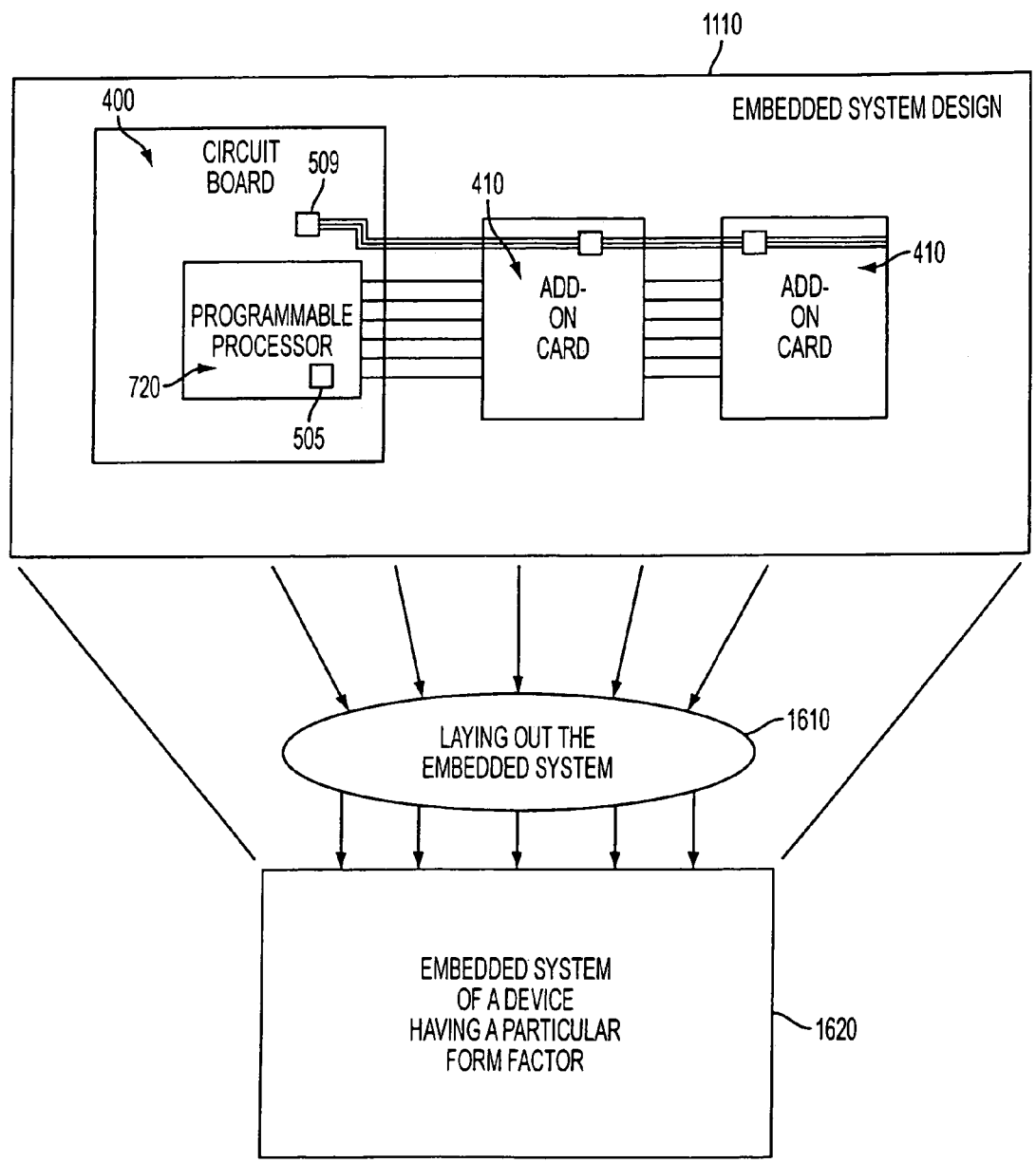
FIG. 16 is a diagram illustrating an embedded system design conforming to a particular form factor, in accordance with an embodiment of the present invention.

FIG. 16 is a diagram illustrating the embedded system design 1110 conforming to a particular form factor, in accordance with an embodiment of the present invention. Specifically, the embedded system design 1110 can include the circuit board 400 with connected add-on cards 410. As previously described, the add-on cards 410 can be any size, such as the double size add-on card 910 of FIG. 9. After connecting the add-on cards 410, the programmable processor 420 of the circuit board 400 receives the configuration image, which permits the add-on cards 410 to communicate with the programmable processor 420. Then, after making any adjustments, such as adding and removing cards with updated configuration images, the embedded system design 1110 is prepared to conform to a particular form factor. For example, an operation 1610 includes laying out the embedded system to conform to the particular form factor. Thus, if the embedded system design 1110 was developed to operate a PDA, the layout process produces an embedded system of a device having the form factor for the PDA. One of ordinary skill in the art will recognize that the particular form factor can be larger or smaller depending on a product's requirements.

Figure 17:
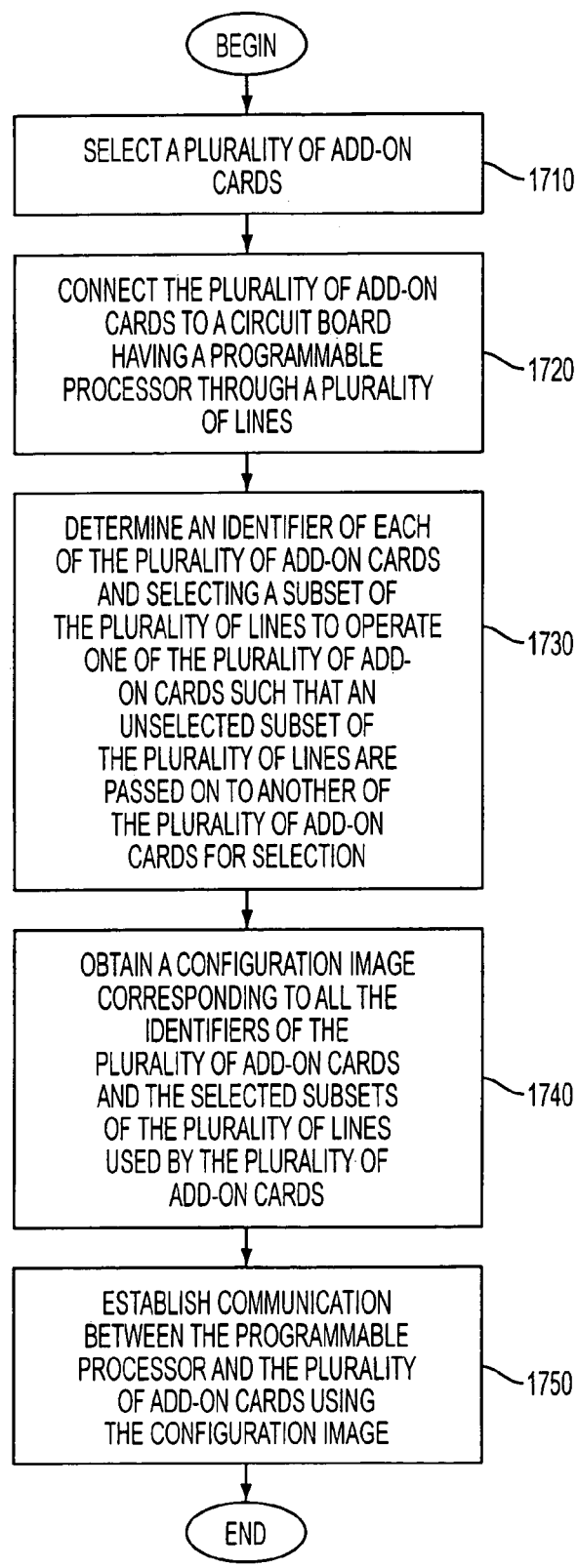
FIG. 17 is a flowchart diagram illustrating operations for and embedded system design through simplified add-on card configuration.

FIG. 17 is a flowchart diagram illustrating operations for an embedded system design through simplified add-on card configuration. Specifically, operation 1710 begins by selecting a plurality of add-on cards. The add-on cards can be selected from any source, such as a catalog of computer parts. Alternatively, the add-on cards can be designed and manufactured for the embedded system design. Regardless of the source of the add-on cards, after the selection, operation 1720 includes connecting the plurality of add-on cards to a circuit board that has a programmable processor. Further, the programmable processor is connected to the add-on cards through a plurality of lines. In one exemplary embodiment, the programmable processor is an FPGA or other suitable processor. In addition, any number of programmable processors can connect to any number of lines. By providing the flexibility of adding any number of programmable processors and plurality of lines, multiple wings can support any number of add-on cards and minimize line lengths.

When connecting the add-on cards to the circuit board, the plurality of lines are tri-stated. Tri-stated lines are not driven or read until the configuration image enables communication over selected lines of the plurality of lines. To obtain the configuration image, in operation 1730, the configuration processor 509 of the circuit board determines an identifier of each of the plurality of add-on cards. During this determination, the order and orientation of the add-on cards with respect to one another is determined. Further, as each add-on card is connected, operation 1730 includes selecting a subset of the plurality of lines to operate one of the plurality of add-on cards such that an unselected subset of the plurality of lines are passed on to another of the plurality of add-on cards for selection.

Then, in operation 1740, the programmable processor obtains the configuration image corresponding to all the identifiers of the plurality of add-on cards and the selected subsets of the plurality of lines used by the plurality of cards. Specifically, a configuration program can receive the identifiers, orientation, and order of the add-on cards and generate the configuration image by obtaining data from a database or other suitable data source. The configuration image is then transmitted to the programmable processor to enable communication over the selected subsets of the plurality of lines.

Thereafter, in operation 1750, the circuit board establishes communication between the programmable processor and the plurality of add-on cards using the configuration image to enable a functioning embedded system design. Consequently the operations end and any modifications to the embedded system design are made by adding and removing add-on cards as needed. Updates to the configuration image are made after the modifications. If the embedded system design is no longer modified and is ready for manufacturing, then the embedded system design is laid out to confirm to a particular form factor.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated.

Any of the operations described herein that form part of the invention are useful machine operations and are in no particular order. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of configuring an embedded system, comprising:
    connecting a plurality of add-on cards to a circuit board having a programmable processor, wherein the programmable processor is configured to communicate with the plurality of add-on cards through selected ones of a plurality of lines;
    connecting the selected ones of the plurality of lines to logic of the plurality of add-on cards, wherein unselected ones of the plurality of lines are passed on from one of the plurality of add-on cards to another of the plurality of add-on cards;
    determining an identifier of each of the plurality of add-on cards, the plurality of add-on cards having a sequence, wherein the sequence, and the identifier of each of the plurality of add-on cards are used to generate a configuration image; and
    configuring the programmable processor to communicate with the plurality of add-on cards through the selected ones of the plurality of lines by obtaining the configuration image;
    wherein in addition to determining the identifier, the method includes determining an orientation of each of the plurality of add-on cards, the determined orientation being used along with the identifier and the sequence in the generation of the configuration image.

2. The method of claim 1, wherein unselected ones of the plurality of lines that are passed on from one of the plurality of add-on cards to another of the plurality of add-on cards are passed through a connector in-to and a connector out-of each add-on card, wherein pin assignments of the connectors are ordered and correlate to an in increasing likelihood of connecting back to the programmable processor, and shifting is done within the add-on cards to maintain the order.

3. The method of claim 1, further including:
    connecting at least one of the plurality of add-on cards, wherein at least one the add-on cards consists of a top card and a bottom card, wherein the bottom card is in communication with the circuit board, and mating of the top card and the bottom card enables an 180 degree rotation of the top card.

4. The method of claim 3, wherein connecting at least one of the plurality of add-on cards consisting of top and bottom cards further includes in their mating mirroring power lines and ground lines between the top and bottom cards.

5. The method of claim 1, further including:
    connecting the plurality of add-on cards through a first wing, wherein the plurality of add-on cards are in communication with the programmable processor through an upper connector system of the circuit board.

6. The method of claim 1, further including:
    connecting the plurality of add-on cards through a second wing, wherein the plurality of add-on cards are in communication with the programmable processor through a lower connector system of the circuit board.

7. The method of claim 1, wherein the identifier of each of the plurality of add-on cards is a unique designator identifying each type of the plurality of add-on cards.

8. The method of claim 1, wherein the sequence is an order of the plurality of add-on cards connected to the circuit board defined between a first add-on card of the plurality of add-on cards connected to the circuit board to a last add-on card of the plurality of add-on cards of the sequence.

9. A method of configuring an embedded system, comprising:
   connecting a plurality of add-on cards to a circuit board having a programmable processor, wherein the programmable processor is configured to communicate with the plurality of add-on cards through selected ones of a plurality of lines;
   connecting the selected ones of the plurality of lines to logic of the plurality of add-on cards, wherein unselected ones of the plurality of lines are passed on from one of the plurality of add-on cards to another of the plurality of add-on cards;
   determining an identifier of each of the plurality of add-on cards, the plurality of add-on cards having a sequence, wherein the sequence, and the identifier of each of the plurality of add-on cards are used to generate a configuration image;
   configuring the programmable processor to communicate with the plurality of add-on cards through the selected ones of the plurality of lines by obtaining the configuration image; and
   simplifying the embedded system to conform to a particular form factor, wherein the simplifying includes eliminating unnecessary lines from the plurality of lines between the programmable processor and the plurality of add-on cards;
   wherein simplifying the embedded system to conform to the particular form factor further includes laying out the embedded system.

10. The method of claim 9, wherein unnecessary lines are unused for communication.

11. A method of configuring an embedded system, comprising:
   connecting a plurality of add-on cards to a circuit board having a programmable processor, wherein the programmable processor is configured to communicate with the plurality of add-on cards through selected ones of a plurality of lines;
   connecting the selected ones of the plurality of lines to logic of the plurality of add-on cards, wherein unselected ones of the plurality of lines are passed on from one of the plurality of add-on cards to another of the plurality of add-on cards;
   determining an identifier of each of the plurality of add-on cards, the plurality of add-on cards having a sequence, wherein the sequence, and the identifier of each of the plurality of add-on cards are used to generate a configuration image; and
   configuring the programmable processor to communicate with the plurality of add-on cards through the selected ones of the plurality of lines by obtaining the configuration image, and
   connecting a double-size add-on card to the circuit board, wherein the double-size add-on card is in communication with the programmable processor through an upper connector system and a lower connector system of the circuit board.

12. The method of claim 11, wherein connecting the double-size add-on card further includes providing a first plurality of lines corresponding to the upper connector system and a second plurality of lines corresponding to the lower connector system of the circuit board.

13. The method of claim 12, further including:
   adding a plurality of shared data bus lines from the circuit board to the plurality of add-on cards, the plurality of shared data bus lines being separate from the plurality of lines, wherein the plurality of shared data bus lines are capable of sharing data among the plurality of add-on cards.

14. The method of claim 13, wherein adding the plurality of shared data bus lines further includes combining the plurality of shared data bus lines of a double-size add-on card to transfer data in parallel.

15. A method of configuring an embedded system, comprising:
   connecting a plurality of add-on cards to a circuit board having a programmable processor, wherein the programmable processor is configured to communicate with the plurality of add-on cards through selected ones of a plurality of lines;
   connecting the selected ones of the plurality of lines to logic of the plurality of add-on cards, wherein unselected ones of the plurality of lines are passed on from one of the plurality of add-on cards to another of the plurality of add-on cards;
   determining an identifier of each of the plurality of add-on cards, the plurality of add-on cards having a sequence, wherein the sequence, and the identifier of each of the plurality of add-on cards are used to generate a configuration image; and
   configuring the programmable processor to communicate with the plurality of add-on cards through the selected ones of the plurality of lines by obtaining the configuration image,
   wherein obtaining the configuration image further includes accessing a database for data corresponding to the identifier of each of the plurality of add-on cards.

16. The method of claim 15, wherein the database is in communication with a configuration program, the configuration program being capable of generating the configuration image and transmitting the configuration image to the programmable processor.

17. The method of claim 16, wherein the configuration program is configured to operate on a server.

18. A method of configuring an embedded system, comprising:
   connecting a plurality of add-on cards to a circuit board having a programmable processor, wherein the programmable processor is configured to communicate with the plurality of add-on cards through selected ones of a plurality of lines;
   connecting the selected ones of the plurality of lines to logic of the plurality of add-on cards, wherein unselected ones of the plurality of lines are passed on from one of the plurality of add-on cards to another of the plurality of add-on cards;
   determining an identifier of each of the plurality of add-on cards, the plurality of add-on cards having a sequence, wherein the sequence, and the identifier of each of the plurality of add-on cards are used to generate a configuration image; and configuring the programmable processor to communicate with the plurality of add-on cards through the selected ones of the plurality of lines by obtaining the configuration image, wherein each of the plurality of add-on cards is obtainable from a catalog.

19. The method of claim 8, wherein the last add-on card of the plurality of cards is the farthest add-on card of the plurality of add-on cards from the circuit board.

20. An embedded system, comprising:
 a programmable processor coupled to a circuit board, the programmable processor being configured to receive a configuration image, wherein the configuration image enables the operation of selected ones of a plurality of lines;
 a sequenced plurality of add-on cards, each of the sequenced plurality of add-on cards having an identifier used for generating the configuration image, the sequenced plurality of add-on cards being connected to the programmable processor through the selected ones of the plurality of lines, wherein the selected ones of the plurality of lines enable communication between the sequenced plurality of add-on cards and the programmable processor; and
 logic of each of the sequenced plurality of add-on cards connected to the selected ones of the plurality of lines, wherein unselected ones of the plurality of lines are passed on from one of the sequenced plurality of add-on cards to another of the sequenced plurality of add-on cards;
 wherein each of the sequenced plurality of add-on cards has an orientation, and each orientation along with each identifier being used in the generation of the configuration image.

21. The embedded system of claim 20, wherein the unselected ones of the plurality of lines are configured to enable communication between the programmable processor and the sequenced plurality of add-on cards if connected to logic of any of the sequenced plurality of add-on cards.

22. The embedded system of claim 20, wherein the plurality of unnecessary lines are unused for communication between the programmable processor and the sequenced plurality of add-on cards.

23. The embedded system of claim 20, further including:
 an add-on card consisting of a top and a bottom card, wherein the bottom card is connected to the programmable processor through the selected ones of the plurality of lines, the top card capable of being rotated 180 degrees to the bottom card.

24. The embedded system of claim 20, further including:
 a plurality of shared data bus lines connecting the programmable processor to the sequenced plurality of add-on cards, the plurality of shared data bus lines being separate from the plurality of lines.

25. The embedded system of claim 24, wherein a double-size add-on card combines the plurality of shared data bus lines to transfer data in parallel.

26. The embedded system of claim 20, wherein the identifier of each of the sequenced plurality of add-on cards is a unique designator identifying each type of the sequenced plurality of add-on cards.

27. The embedded system of claim 20, wherein the logic of each of the sequenced plurality is configured to operate using the selected ones of the plurality of lines.

28. An embedded system, comprising:
 a programmable processor coupled to a circuit board, the programmable processor being configured to receive a configuration image, wherein the configuration image enables the operation of selected ones of a plurality of lines;
 a sequenced plurality of add-on cards, each of the sequenced plurality of add-on cards having an identifier used for generating the configuration image, the sequenced plurality of add-on cards being connected to the programmable processor through the selected ones of the plurality of lines, wherein the selected ones of the plurality of lines enable communication between the sequenced plurality of add-on cards and the programmable processor; and
 logic of each of the sequenced plurality of add-on cards connected to the selected ones of the plurality of lines, wherein unselected ones of the plurality of lines are passed on from one of the sequenced plurality of add-on cards to another of the sequenced plurality of add-on cards,
 wherein a particular form factor includes a laid out embedded system design different than one achieved using the add-on cards.

29. An embedded system, comprising:
 a programmable processor coupled to a circuit board, the programmable processor being configured to receive a configuration image, wherein the configuration image enables the operation of selected ones of a plurality of lines;
 a sequenced plurality of add-on cards, each of the sequenced plurality of add-on cards having an identifier used for generating the configuration image, the sequenced plurality of add-on cards being connected to the programmable processor through the selected ones of the plurality of lines, wherein the selected ones of the plurality of lines enable communication between the sequenced plurality of add-on cards and the programmable processor;
 logic of each of the sequenced plurality of add-on cards connected to the selected ones of the plurality of lines, wherein unselected ones of the plurality of lines are passed on from one of the sequenced plurality of add-on cards to another of the sequenced plurality of add-on cards; and
 a lower connector system of the circuit board and an upper connector system of the circuit board, wherein a first plurality of lines corresponds to the lower connector system and a second plurality of lines corresponds to the upper connector system.

30. The embedded system of claim 29, wherein a double-size add-on card connects to the circuit board through the lower connector system and the upper connector system.

31. An embedded system, comprising:
 a programmable processor coupled to a circuit board, the programmable processor being configured to receive a configuration image, wherein the configuration image enables the operation of selected ones of a plurality of lines;
 a sequenced plurality of add-on cards, each of the sequenced plurality of add-on cards having an identifier used for generating the configuration image, the sequenced plurality of add-on cards being connected to the programmable processor through the selected ones of the plurality of lines, wherein the selected ones of the plurality of lines enable communication between the sequenced plurality of add-on cards and the programmable processor; and
 logic of each of the sequenced plurality of add-on cards connected to the selected ones of the plurality of lines, wherein unselected ones of the plurality of lines are passed on from one of the sequenced plurality of add-on cards to another of the sequenced plurality of add-on cards;

wherein the configuration image is generated by a configuration program accessing data corresponding to the identifier and an order of the sequenced plurality of add-on cards.

32. The embedded system of claim 31, wherein the order of the sequenced plurality of add-on cards is defined between a first add-on card of the sequenced plurality of add-on cards connected to the circuit board to a last add-on card of the sequenced plurality of add-on cards.

33. The embedded system of claim 32, wherein the last add-on card of the sequenced plurality of cards is the farthest add-on card of the sequenced plurality of add-on cards coupled to the circuit board.

34. An embedded system, comprising:
means for determining a configuration image, the configuration image being associated with identifiers of a sequenced plurality of add-on cards; and
means for connecting the sequenced plurality of add-on cards to a circuit board having a programmable processor, the programmable processor being in communication with the sequenced plurality of add-on cards through selected ones of a plurality of lines, wherein the programmable processor is configured to use the configuration image to establish communication with the sequenced plurality of add-on cards, such that unselected ones of the plurality of lines are passed from one of the plurality of add-on cards to another of the plurality of add-on cards.

35. An embedded system as recited in claim 34, wherein the means for determining the configuration image further accounts for an orientation of each of the sequenced plurality of add-on cards.

36. The embedded system of claim 34, further including:
means for providing an embedded system design conforming to a particular form factor.

37. The embedded system of claim 34, further including:
means for generating and transmitting the configuration image.

38. The embedded system of claim 34, further including:
means for minimizing the plurality of selected lines.

39. A method for embedded system design, comprising:
providing a programmable processor on a circuit board, the programmable processor communicating through a set of pins;
coupling an add-on card to the circuit board to enable connection to the programmable processor, the add-on card using one or more of the set of pins;
passing through any of the set of pins not used by the add-on card to a next add-on card that can be connected to the add-on card, wherein each pin of the set of pins from the programmable processor is directly linked to card logic of each of the add-on card and the next add-on card;
determining an identifier, a sequence of each of the add-on card and the next add-on card;
generating a configuration image for connected add-on card and the next add-on card, the configuration image capable of being stored in memory of the programmable processor, the configuration image enabling functional communication between the programmable processor and each of the add-on card and the next add-on card; and
determining an orientation of each of the add-on card and the next add-on card, the orientation taken into account when generating the configuration image.

40. A method for embedded system design as recited in claim 39, further comprising:
testing the functional communication using the add-on card and the next add-on card.

41. A method for embedded system design, comprising:
providing a programmable processor on a circuit board, the programmable processor communicating through a set of pins;
coupling an add-on card to the circuit board to enable connection to the programmable processor, the add-on card using one or more of the set of pins;
passing through any of the set of pins not used by the add-on card to a next add-on card that can be connected to the add-on card, wherein each pin of the set of pins from the programmable processor is directly linked to card logic of each of the add-on card and the next add-on card;
determining an identifier, a sequence of each of the add-on card and the next add-on card;
generating a configuration image for connected add-on card and the next add-on card, the configuration image capable of being stored in memory of the programmable processor, the configuration image enabling functional communication between the programmable processor and each of the add-on card and the next add-on card; and
upon completing the testing of the functional communication using the configuration image, the method further includes,
generating a new form factor, the new form factor being defined on a target circuit board having the card logic of the add-on card and the next add-on card, the target circuit further including logic of the programmable processor and the memory, the memory holding the configuration image.

42. A method for embedded system design as recited on claim 41, wherein the target circuit board includes line interconnections between the programmable processor and the card logic of the add-on card and the next add-on card, the line interconnections being identical to the line interconnections identified when each pin of the set of pins from the programmable processor was directly linked to card logic of each of the add-on card and the next add-on card.

* * * * *